(12) United States Patent
Chiu et al.

(10) Patent No.: US 10,741,610 B2
(45) Date of Patent: Aug. 11, 2020

(54) MEMORY CELLS AND MEMORY ARRAY STRUCTURES INCLUDING RRAM, AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Sheng Fen Chiu, Shanghai (CN); Heng Cao, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 163 days.

(21) Appl. No.: 15/927,665

(22) Filed: Mar. 21, 2018

(65) Prior Publication Data

US 2018/0277600 A1    Sep. 27, 2018

(30) Foreign Application Priority Data

Mar. 22, 2017   (CN) .......................... 2017 1 0176063

(51) Int. Cl.
*H01L 27/24*   (2006.01)
*H01L 29/06*   (2006.01)
(Continued)

(52) U.S. Cl.
CPC ........ *H01L 27/2409* (2013.01); *H01L 21/265* (2013.01); *H01L 21/76224* (2013.01);
(Continued)

(58) Field of Classification Search
CPC ............... H01L 27/2409; H01L 21/265; H01L 21/76224; H01L 27/2463; H01L 29/0649;
(Continued)

(56) References Cited

U.S. PATENT DOCUMENTS 5,780,899 A  *   7/1998  Hu ........................ H01L 27/092
                                                         257/335
2008/0258129 A1 * 10/2008  Toda ........................ G11C 11/56
                                                            257/5
(Continued)

*Primary Examiner* — Khiem D Nguyen
(74) *Attorney, Agent, or Firm* — Anova Law Group, PLLC

(57) ABSTRACT

A memory cell includes a substrate including a first diode region, a second diode region, a third diode region, and a fourth diode region, a first well region formed in the first diode region and the second diode region, a second well region formed in the third diode region and the fourth diode region, a doped conductive region formed on the first well region and the second well region, and a deep trench isolation structure formed in the substrate to electrically isolate different portions of each of the first well region, the second well region, and the doped conductive region formed over different diode regions. The second well region and the first well region have different doping types. The memory cell includes a resistance random access memory device formed over the substrate and electrically connected to the doped conductive region in the second diode region and the third diode region.

20 Claims, 9 Drawing Sheets

(51) Int. Cl.
*H01L 21/265* (2006.01)
*H01L 45/00* (2006.01)
*H01L 21/762* (2006.01)

(52) U.S. Cl.
CPC ...... *H01L 27/2463* (2013.01); *H01L 29/0649* (2013.01); *H01L 45/1233* (2013.01); *H01L 45/16* (2013.01)

(58) Field of Classification Search
CPC ............ G11C 13/0002; G11C 2213/72; G11C 13/0097; G11C 11/419
See application file for complete search history.

(56) References Cited

U.S. PATENT DOCUMENTS

| | | | | |
|---|---|---|---|---|
| 2012/0044748 | A1* | 2/2012 | Chung | G11C 11/1659 365/148 |
| 2013/0207067 | A1* | 8/2013 | Pan | H01L 29/7827 257/4 |
| 2017/0025473 | A1* | 1/2017 | Lai | H01L 27/2409 |

\* cited by examiner

MEMORY CELLS AND MEMORY ARRAY STRUCTURES INCLUDING RRAM, AND FABRICATION METHODS THEREOF

CROSS-REFERENCES TO RELATED APPLICATIONS

This application claims the priority of Chinese Patent Application No. CN201710176063.6, filed on Mar. 22, 2017, the entire content of which is incorporated herein by reference.

FIELD OF THE DISCLOSURE

The present disclosure generally relates to the field of semiconductor fabrication technology and, more particularly, relates to memory cells and memory array structures, and fabrication methods thereof.

BACKGROUND

Semiconductor memories are indispensable components in various electronic device systems. Among semiconductor memories, nonvolatile semiconductor memories demonstrate a unique capability for data storage in case of power failure, and thus have been widely used in various mobile and portable devices, including mobile phones, notebook computers, personal digital assistant (PDA) devices, etc. Resistance random access memories (RRAMs) demonstrate many advantages, such as simple fabrication process, fast read and write speed, high storage density, nonvolatile storage, compatibility with the traditional silicon integrated circuit (IC) technology, etc. Therefore, RRAMs have great application potential in the field of semiconductor memories.

The RRAM is a nonvolatile memory developed based on the electrically-induced-resistance-change effect of some materials. The functional device of the RRAM is a simple metal-insulator-metal (MIM) capacitor. The material of the insulation layer in the MIM capacitor has the electrically-induced-resistance-change property. That is, the resistance of the material used to form the insulation layer in the MIM capacitor can be reversibly changed under the control of specific external signals. Based on the change in the voltage applied on the insulation layer, the resistance of the insulation layer may be changed between a high-resistance state and a low-resistance state, and thus the RRAM may be able to turn on or turn off the current channel. Specifically, when the resistance changes from the high-resistance state (i.e. an off-state) to the low-resistance state (i.e. an on-state), the operation process corresponds to a set operation; when the resistance changes from the low-resistance state (i.e. the on-state) to the high-resistance state (i.e. the off-state), the operation process corresponds to a reset operation.

Further, two diodes (D) with rectification characteristics are integrated in each RRAM (R) device to form a 2D1R memory array structure. When the 2D1R memory array structure is applied to a memory structure, the memory structure may demonstrate advantages of high operation current and low leakage current.

However, the performance of conventional memory structures still needs to be improved. The disclosed memory cells, memory array structures, and methods thereof are directed to solve one or more problems set forth above and other problems in the art.

BRIEF SUMMARY OF THE DISCLOSURE

One aspect of the present disclosure provides a memory cell. The memory cell includes a substrate including a first diode region, a second diode region, a third diode region, and a fourth diode region arranged consecutively in a row direction, a first well region formed in the substrate of the first diode region and the second diode region, and a second well region formed in the substrate in the third diode region and the fourth diode region. The doping type of the second well region is different from the doping type in the first well region. The memory cell also includes a doped conductive region formed on the first well region and the second well region, and a deep trench isolation structure formed in the substrate. The deep trench isolation structure electrically isolates the first well region in the first diode region from the first well region in the second diode region, the second well region in the third diode region from the second well region in the fourth diode region, the doped conductive region in the first diode region from the doped conductive region in the second diode region, and the doped conductive region in the third diode region from the doped conductive region in the fourth diode region. The memory cell further includes a resistance random access memory (RRAM) device formed over the substrate. The RRAM device is electrically connected to the doped conductive region in the second diode region and the doped conductive region in the third diode region.

Another aspect of the present disclosure provides a method for fabricating a memory cell. The method includes providing a substrate including a first diode region, a second diode region, a third diode region, and a fourth diode region arranged consecutively in a row direction, forming a first well region in the substrate of the first diode region and the second diode region, and forming a second well region in the substrate in the third diode region and the fourth diode region. The doping type of the second well region is different from the doping type in the first well region. The method also includes forming a doped conductive region on the first well region and the second well region, forming a deep trench isolation structure in the substrate to electrically isolate the first well region in the first diode region from the first well region in the second diode region, the second well region in the third diode region from the second well region in the fourth diode region, the doped conductive region in the first diode region from the doped conductive region in the second diode region, and the doped conductive region in the third diode region from the doped conductive region in the fourth diode region, and forming an RRAM device over the substrate to electrically connect the doped conductive region in the second diode region and the doped conductive region in the third diode region.

Another aspect of the present disclosure provides a memory array structure. The memory array structure includes a plurality of memory cells described above. The plurality of memory cells are arranged into an array with a plurality of rows perpendicular to a plurality of columns. The first well regions in the first diode regions of the memory cells in a same column are connected to each other, the first well regions in the second diode regions of the memory cells in a same column are connected to each other, the second well regions in the third diode regions of the memory cells in a same column are connected to each other, and the second well regions in the fourth diode regions of the memory cells in a same column are connected to each other. The memory array structure includes a plurality of word lines, a plurality of reset lines, and a plurality of bit lines. The RRAM devices of the memory cells in a same row are electrically connected to one word line, the first well regions in the first diode regions of the memory cells in a same column are electrically connected to one reset line and the first well regions in the second diode regions of the memory cells in a same column are also electrically connected to one reset line, and the second well regions in the third diode regions of the memory cells in a same column are electrically connected to one bit line and the second well regions in the fourth diode regions of the memory cells in a same column are also electrically connected to one bit line.

Another aspect of the present disclosure provides a method for fabricating a memory array structure. The method for fabricating the memory array structure includes forming a plurality of memory cells into an array with a plurality of rows perpendicular to a plurality of columns. Forming each memory cell on the substrate includes providing a substrate including a first diode region, a second diode region, a third diode region, and a fourth diode region arranged consecutively in a row direction, forming a first well region in the substrate of the first diode region and the second diode region, and forming a second well region in the substrate in the third diode region and the fourth diode region. The doping type of the second well region is different from the doping type in the first well region. Forming each memory cell on the substrate also includes forming a doped conductive region on the first well region and the second well region, forming a deep trench isolation structure in the substrate to electrically isolate the first well region in the first diode region from the first well region in the second diode region, the second well region in the third diode region from the second well region in the fourth diode region, the doped conductive region in the first diode region from the doped conductive region in the second diode region, and the doped conductive region in the third diode region from the doped conductive region in the fourth diode region, and forming an RRAM device over the substrate to electrically connect the doped conductive region in the second diode region and the doped conductive region in the third diode region. The first well regions in the first diode regions of the memory cells in a same column are connected to each other, the first well regions in the second diode regions of the memory cells in a same column are connected to each other, the second well regions in the third diode regions of the memory cells in a same column are connected to each other, and the second well regions in the fourth diode regions of the memory cells in a same column are connected to each other. The method for fabricating the memory array structure also includes forming a plurality of word lines, forming a plurality of reset lines, and forming a plurality of bit lines. The RRAM devices of the memory cells in a same row are electrically connected to one word line, the first well regions in the first diode regions of the memory cells in a same column are electrically connected to one reset line and the first well regions in the second diode regions of the memory cells in a same column are also electrically connected to one reset line, and the second well regions in the third diode regions of the memory cells in a same column are electrically connected to one bit line and the second well regions in the fourth diode regions of the memory cells in a same column are also electrically connected to one bit line.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As miniaturization becomes the direction for developing semiconductor devices, the lithography process window for forming the well regions of the diodes in memory structures becomes smaller and smaller. Therefore, the performance of the formed memory structures may need to be improved.

Figure 16:
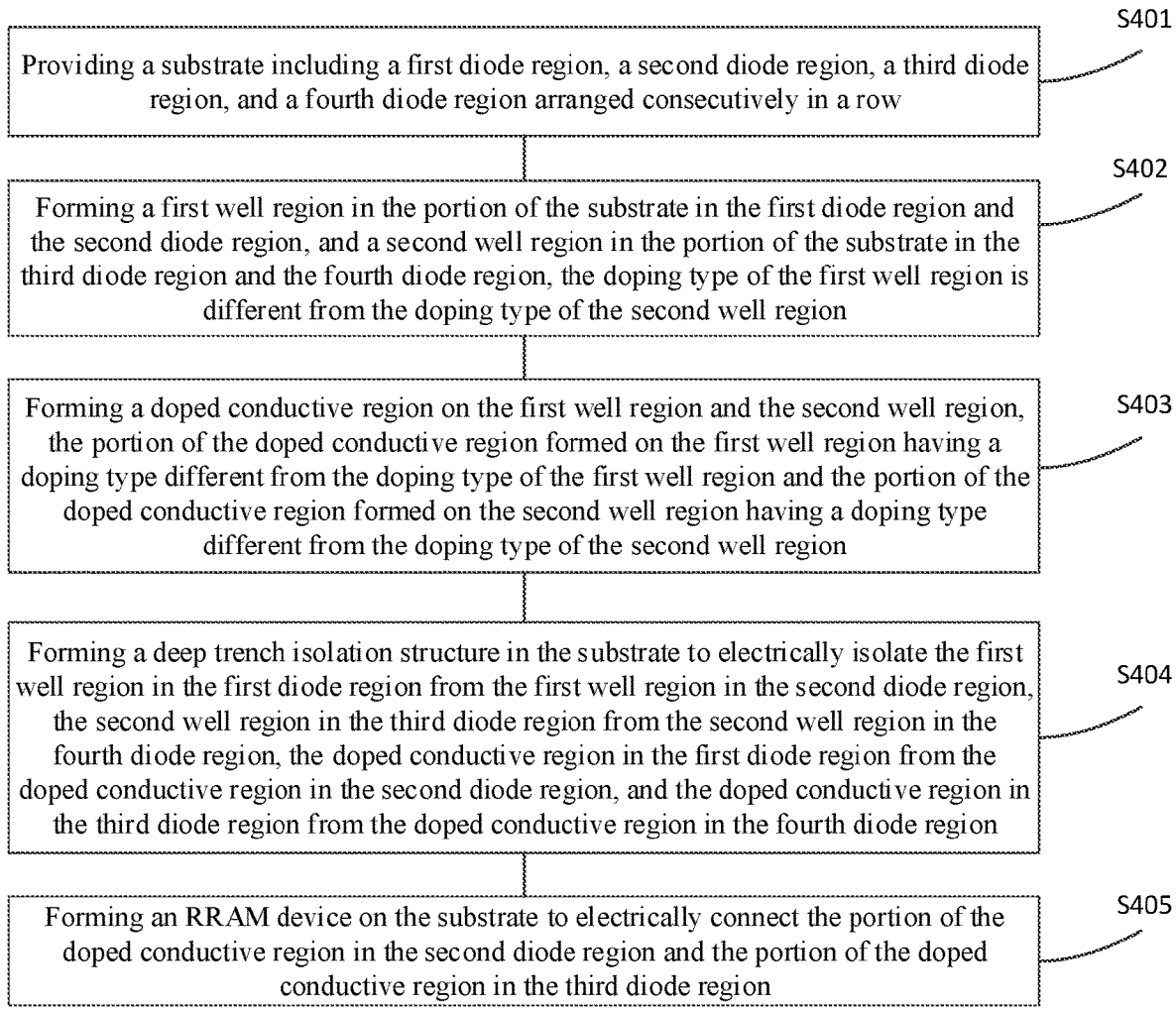
FIG. 16 illustrates a flowchart of an exemplary method for fabricating a memory cell consistent with various embodiments of the present disclosure.

The present disclosure provides memory cells and a method for fabricating memory cells to increase the lithography process window for forming the well regions of the diodes, and thus improve the performance of the memory cell. FIG. 16 illustrates a flowchart of an exemplary method for fabricating a memory cell consistent with various embodiments of the present disclosure. FIGS. 1-5 illustrate schematic views of semiconductor structures at certain stages of the fabrication method for the memory cell.

Figure 1:
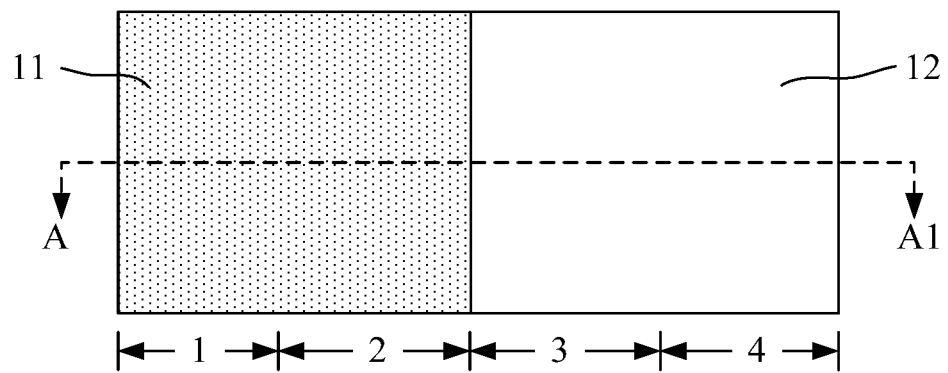
FIGS. 1-5 illustrate schematic views of semiconductor structures at certain stages of an exemplary method for fabricating a memory cell consistent with various embodiments of the present disclosure.
Figure 2:
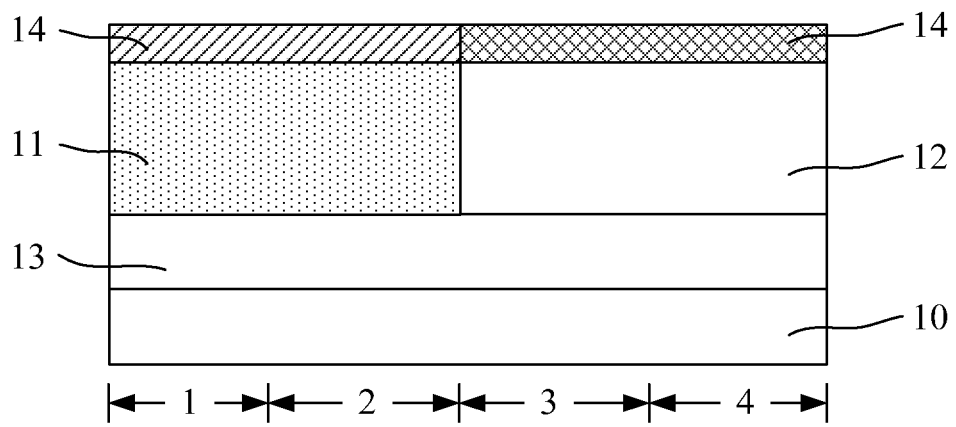

Referring to FIG. 16, to fabricate a memory cell, a substrate may be provided (S401). FIGS. 1-2 show schematic views of a substrate consistent with various embodiments of the present disclosure. FIG. 1 shows a schematic top view of the substrate, and FIG. 2 shows a schematic cross-section view of the substrate shown in FIG. 1 along an AA1 direction.

Referring to FIGS. 1-2, a substrate 10 may be provided. The substrate 10 may include a first diode region 1, a second diode region 2, a third diode region 3, and a fourth diode region 4 arranged consecutively in a row. The substrate 10 may provide a process basis for subsequent formation of diodes.

In one embodiment, the substrate 10 may be made of silicon. In other embodiments, the substrate may also be made of germanium, SiGe, SiC, GaAs, InAs, or any other appropriate semiconductor material.

In a subsequent process, a diode may be formed in each of the first diode region 1, the second diode region 2, the third diode region 3, and the fourth diode region 4. The polarities of the diodes formed in the first diode region 1 and the second diode region 2 may be the same, and the polarities of the diodes formed in the third diode region 3 and the fourth diode region 4 may be the same. In addition, the polarity of the diode formed in the first diode region 1 may be different from the polarity of the diode formed in the third diode region 3.

Further, returning to FIG. 16, a first well region may be formed in the portion of the substrate in the first diode region and the second diode region and a second well region may be formed in the portion of the substrate in the third diode region and the fourth diode region, the first well region and the second well region having different doping types (S402).

Referring to FIGS. 1-2, a first well region 11 may be formed in the portion of the substrate 10 in the first diode region 1 and the second diode region 2, and a second well region 12 may be formed in the portion of the substrate 10 in the third diode region 3 and the fourth diode region 4. The doping type in the second well region 12 may be different from the doping type in the first well region 11.

The doping type of the first well region 11 may be N-type or P-type, and accordingly, the doping type of the second well region 12 may be P-type or N-type. The doping ions for N-type doping may include P ions, As ions, Sb ions, etc. The doping ions for P-type doping may include B ions, Ga ions, In ions, etc.

In one embodiment, the doping type of the first well region 11 is P-type and the doping type of the second well region 12 is N-type. In other embodiments, the doping type of the first well region may be N-type and the doping type of the second well region 12 may be P-type.

The first well region 11 may be formed by a process including the following exemplary steps. First, a first photoresist layer may be formed on the third diode region 3 and the fourth diode region 4. The first well region 11 may then be formed by a doping process performed on the first diode region 1 and the second diode region 2 using the first photoresist layer as a mask. Further, the first photoresist layer may be removed.

The second well region 12 may be formed by a process including the following exemplary steps. First, a second photoresist layer may be formed on the first diode region 1 and the second diode region 2. The second well region 12 may then be formed by a doping process performed on the third diode region 3 and the fourth diode region 4 using the second photoresist layer as a mask. Further, the second photoresist layer may be removed.

In one embodiment, the first well region 11 may be formed before the second well region 12 is formed. In other embodiments, the first well region may be formed after the second well region is formed.

Because the lithography process window for forming the first well region 11 may include both the first diode region 1 and the second diode region 2, the lithography process window for forming the first well region 11 may be two times of the lithography process window for forming a first well region only in a first diode region or forming a first well region only in a second diode region. Similarly, because the lithography process window for forming the second well region 12 may include both the third diode region 3 and the fourth diode region 4, the lithography process window for forming the second well region 12 may be two times of the lithography process window for forming a second well region only in a third diode region or forming a second well region only in a fourth diode region. Therefore, forming the first well region 11 and the second well region 12 may be less difficult, and the position accuracy of the first well region 11 and the second well region 12 may be improved.

In one embodiment, forming the memory cell may also include forming an N-type deep well region 13 in the substrate 10. The N-type deep well region 13 may be located under the first well region 11 and the second well region 12. Accordingly, prior to forming the first well region 11 and the second well region 12, the fabrication method may also include forming the N-type deep well region 13 through a doping process performed the substrate 10.

The N-type deep well region 13 may help preventing the P-type doping ions in the first well region 11 from diffusing into the substrate 10.

Further, returning to FIG. 1, a doped conductive region may be formed on the first well region and the second well region (S403). FIG. 2 shows a schematic cross-section view of a semiconductor structure with a doped conductive region formed on the first well region and the second well region. For illustration purpose, the doped conductive region is not shown in FIG. 1.

Referring to FIG. 2, a doped conductive region 14 may be formed on the first well region 11 and the second well region 12. The doped conductive region 14 may be formed in the substrate 10. The first diode region 1 together with the portion of the doped conductive region 14 formed in the first diode region 1 may form a diode, the second diode region 2 together with the portion of the doped conductive region 14 formed in the second diode region 2 may form a diode, the third diode region 3 together with the portion of the doped conductive region 14 formed in the third diode region 3 may form a diode, and the fourth diode region 4 together with the portion of the doped conductive region 14 formed in the fourth diode region 4 may form a diode.

The doping type of the doped conductive region 14 may be N-type or P-type. Specifically, different portions of the doped conductive region 14 may be doped with different types of doping ions. Moreover, the doping type of the portion of the doped conductive region 14 formed over the first well region 11 may be different from the doping type of the first well region 11, and the doping type of the portion of the doped conductive region 14 formed over the second well region 12 may be different from the doping type of the second well region 12.

In one embodiment, the doping type of the first well region 11 is P-type, and accordingly, the doping type of the portion of the doped conductive region 14 formed over the first doped region 11 may be N-type. In addition, the doping type of the second well region 12 is N-type, and accordingly, the doping type of the portion of the doped conductive region 14 formed over the second doped region 12 may be P-type.

The process to form the doped conductive region 14 may include the following exemplary steps. First, a third photoresist layer may be formed over the first well region 11. A doping process may be performed on the second well region 12 using the third photoresist layer as a mask. During the doping process, a top portion of the second well region 12 may be doped to form the portion of the doped conductive region 14 on the second well region 12. The third photoresist layer may then be removed. Further, a fourth photoresist layer may be formed over the second well region 12. A doping process may be performed on the first well region 11 using the fourth photoresist layer as a mask. During the doping process, a top portion of the first well region 11 may be doped to form the portion of the doped conductive region 14 on the first well region 11. The fourth photoresist layer may then be removed.

Figure 3:
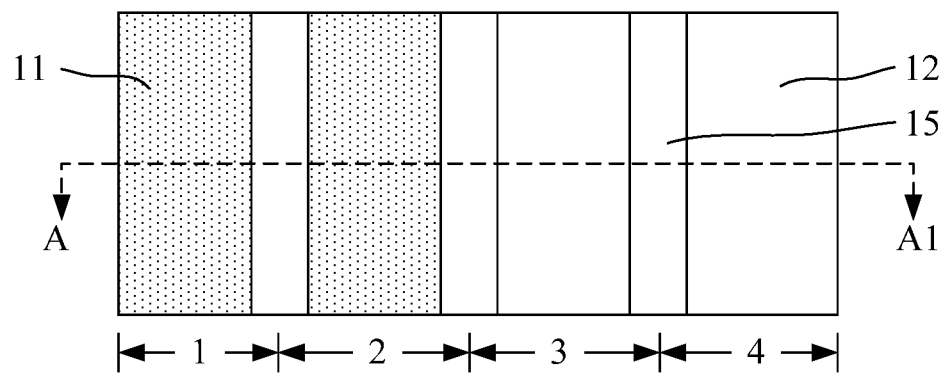
Figure 4:
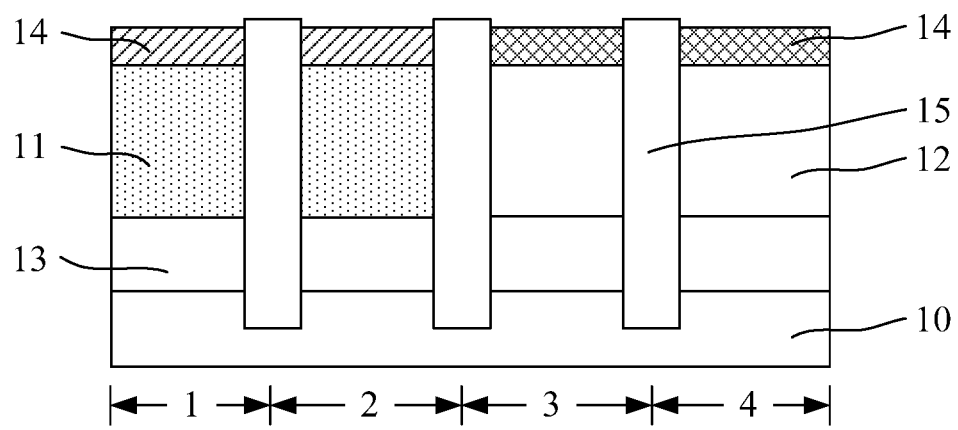

Further, returning to FIG. 16, a deep trench isolation structure may be formed in the substrate to electrically isolate the portion of the first well region in the first diode region from the portion of the first well region in the second diode region, the portion of the second well region in the third diode region from the portion of the second well region in the fourth diode region, the portion of the doped conductive region in the first diode region from the portion of the doped conductive region in the second diode region, and the portion of the doped conductive region in the third diode region from the portion of the doped conductive region in the fourth diode region (S404). FIGS. 3-4 show schematic views of a semiconductor structure consistent with various embodiments of the present disclosure. FIG. 3 shows a schematic top view of the semiconductor structure, and FIG. 4 shows a schematic cross-section view of the semiconductor structure shown in FIG. 3 in an AA1 direction.

Referring to FIGS. 3-4, a deep trench isolation structure 15 may be formed in the substrate 10 to electrically isolate the portion of the first well region 11 in the first diode region 1 from the portion of the first well region 11 in the second diode region 2, the portion of the second well region 12 in the third diode region 3 from the portion of the second well region 12 in the fourth diode region 4, the portion of the doped conductive region 14 in the first diode region 1 from the portion of the doped conductive region 14 in the second diode region 2, and the portion of the doped conductive region 14 in the third diode region 3 from the portion of the doped conductive region 14 in the fourth diode region 4.

In one embodiment, the bottom surface of the deep trench isolation structure 15 may be lower than the bottom surface of the first well region 11 and may also lower than the bottom surface of the second well region 12. In other embodiments, the bottom surface of the deep trench isolation structure may be leveled with the bottom surfaces of the first well region and the second well region.

In one embodiment, the deep trench isolation structure 15 may also electrically isolate the portion of the first well region 11 in the second diode region 2 from the portion of the second well region 12 in the third diode region 3. In addition, the deep trench isolation structure 15 may also electrically isolate the portion of the doped conductive region 14 in the second diode region 2 from the portion of the doped conductive region 14 in the third diode region 3.

Moreover, in one embodiment, the bottom of the deep trench isolation structure 115 may be lower than the bottom of the N-type deep well region 13 to ensure the electric isolation between different portions of the N-type deep well region 13 in neighboring diode regions.

The deep trench isolation structure 15 may be formed by a process including the following exemplary steps. A patterned layer may be formed on the doped conductive region 14 over the substrate 10. The patterned layer may expose a portion of the surface corresponding to the boundaries between different diode regions. A portion of the doped conductive region 14, the first well region 11, the second well region 12, the N-type deep well region 13, and the substrate 10 may be removed through etching using the patterned layer as an etch mask. A deep trench may then be formed in the substrate 10 at each boundary between two neighboring diode regions. Further, each deep trench may be filled to form the deep trench isolation structure. The patterned layer may then be removed. The deep trench isolation structure 15 may be made of a material including $SiO_x$, $SiN_x$, SiON, etc.

In one embodiment, the first well region 11 and the second well region 12 may be formed before forming the deep trench isolation structure 15. In other embodiments, the deep trench isolation structure may be formed before the first well region and the second well region are formed. Moreover, in other embodiments, the deep trench isolation structure may be formed before the doped conductive region is formed.

Figure 5:
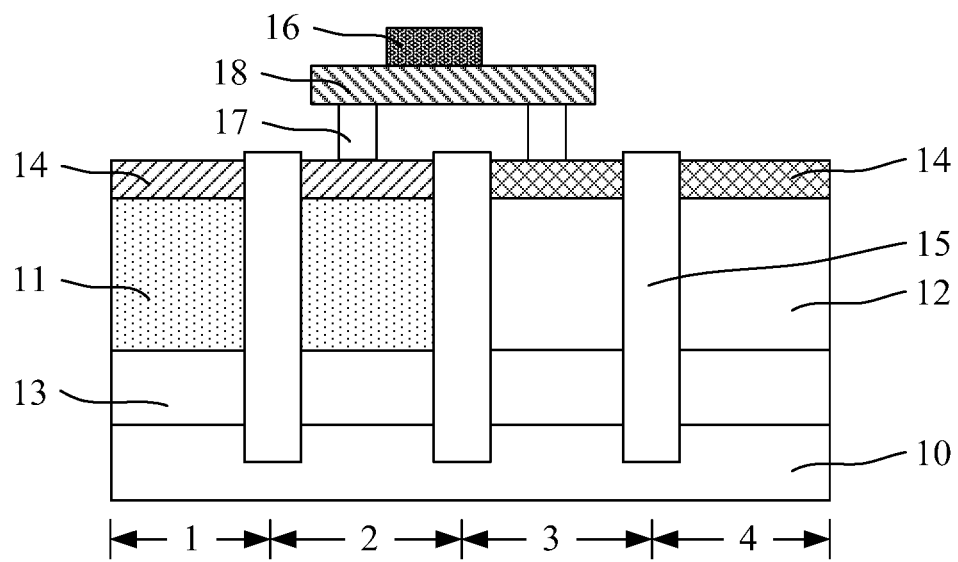

Further, returning to FIG. 16, an RRAM device electrically connected to the portion of the doped conductive region in the second diode region and the portion of the doped conductive region in the third diode region may be formed on the substrate (S405). FIG. 5 shows a schematic cross-section view of a semiconductor structure consistent with various embodiments of the present disclosure.

Referring to FIG. 5, an RRAM device 16 may be formed on the substrate 10. The RRAM device 16 may be electrically connected to the portion of the doped conductive region 14 in the second diode region 2 and may also be electrically connected to the portion of the doped conductive region 14 in the third diode region 3.

The RRAM device 16 may include a lower electrode layer, a resistance-changeable dielectric layer formed on the lower electrode layer, and an upper electrode layer formed on the resistance-changeable dielectric layer. The resistance-changeable dielectric layer may be made of a material including aluminum oxide, titanium oxide, zirconium oxide, etc.

In one embodiment, prior to forming the RRAM device 16, the fabrication method may also include forming a conduction plug 17 on the doped conductive region 14 in the second diode region 2 and a conduction plug 17 on the doped conductive region 14 in the third diode region 3, and then forming a metal layer 18 to electrically connect the two conduction plugs 17 formed in the second diode region 2 and the third diode region 3, respectively. Accordingly, the RRAM device 16 may be formed on the metal layer 18. Therefore, the metal layer 18 may be located between the RRAM device 16 and the conduction plugs 17.

Moreover, in one embodiment, the diode formed in the second diode region 2, the diode formed in the third diode region 3, and the RRAM device 16 may together form a 2D1R memory cell.

The fabrication method for the memory cell may also include forming a first dielectric layer (not shown) on the substrate such that the conduction plugs 17 and the metal layer 18 may be formed in the first dielectric layer. Accordingly, the first dielectric layer may be formed before the formation of the conduction plugs 17 and the metal layer 18 or may be formed during the process to form the conduction plugs 17 and the metal layer 18. The top surface of the first dielectric layer may be leveled with the top surface of the metal layer 18. Moreover, the method for fabricating the memory cell may also include forming a second dielectric layer (not shown) on the first dielectric layer prior to or after forming the RRAM device. The RRAM device 16 may be located in the second dielectric layer, and the top surface of the RRAM device may be leveled with the top surface of the second dielectric layer.

According to the disclosed method for fabricating a memory cell, the lithography process window for forming the first well region 11 and the second well region 12 may be increased, matching the miniaturization trend of device development. In the meantime, the position accuracy of the first well region 11 and the second well region 12 may be improved. Moreover, because of the increase in the lithography process window for forming the first well region 11 and the second well region 12, the area size of the memory cell may be made even smaller.

Further, the present disclosure also provides a memory cell. FIG. 5 illustrates a schematic cross-section view of an exemplary memory cell consistent with various embodiments of the present disclosure.

Referring to FIG. 5, the memory cell may include a substrate 10. The substrate 10 may further include a first diode region 1, a second diode region 2, a third diode region 3, and a fourth diode region 4 arranged consecutively along a row direction.

The memory cell may also include a first well region 11 formed in the portion of the substrate 10 in the first diode region 1 and the second diode region 2 and a second well region 12 formed in the portion of the substrate 10 in the third diode region 3 and the fourth diode region 4. The doping type in the second well region 12 may be different from the doping type in the first well region 11.

The memory cell may also include a doped conductive region 14 formed on the first well region 11 and the second well region 12, and a deep trench isolation structure 15. The deep trench isolation structure 15 may electrically isolate the portion of the first well region 11 in the first diode region 1 from the portion of the first well region 11 in the second diode region 2, the portion of the second well region 12 in the third diode region 3 from the portion of the second well region 12 in the fourth diode region 4, the portion of the doped conductive region 14 in the first diode region 1 from the portion of the doped conductive region 14 in the second diode region 2, and the portion of the doped conductive region 14 in the third diode region 3 from the portion of the doped conductive region 14 in the fourth diode region 4.

The memory cell may also include an RRAM device 16 formed over the substrate 10. The RRAM device 16 may be electrically connected to the portion of the doped conductive region 14 in the second diode region 2 and may also be electrically connected to the portion of the doped conductive region 14 in the third diode region 3.

The doping type of the first well region 11 may be N-type or P-type, and accordingly, the doping type of the second well region 12 may be P-type or N-type. The doping ions for N-type doping may include P ions, As ions, Sb ions, etc. The doping ions for P-type doping may include B ions, Ga ions, In ions, etc.

In one embodiment, the doping type of the first well region 11 is P-type and the doping type of the second well region 12 is N-type. In other embodiments, the doping type of the first well region may be N-type and the doping type of the second well region 12 may be P-type.

Further, the doping type of the portion of the doped conductive region 14 formed over the first well region 11 may be different from the doping type of the first well region 11, and the doping type of the portion of the doped conductive region 14 formed over the second well region 12 may be different from the doping type of the second well region 12.

Moreover, the deep trench isolation structure 15 may also electrically isolate the portion of the first well region 11 in the second diode region 2 from the portion of the second well region 12 in the third diode region 3. In addition, the deep trench isolation structure 15 may also electrically isolate the portion of the doped conductive region 14 in the second diode region 2 from the portion of the doped conductive region 14 in the third diode region 3.

In one embodiment, the deep trench isolation structure 15 is made of $SiO_x$. In other embodiments, the deep trench isolation structure 15 may be made of $SiN_x$, SiON, or any other appropriate material.

In one embodiment, the memory cell may also include an N-type deep well region 13 formed in the substrate 10. The N-type deep well region 13 may be located under the first well region 11 and the second well region 12. Moreover, the bottom surface of the deep trench isolation structure 15 may be lower than the bottom surface of the N-type deep well region 13.

The memory cell may also include two conduction plugs 17. The two conduction plugs 17 may be formed on the doped conductive region 14 in the second diode region 2 and in the third diode region 3, respectively. The memory cell may further include a metal layer 18 electrically connected to the conduction plugs 17. The metal layer 18 may be located between the conduction plugs 17 and the RRAM device 16.

The memory cell may also include a first dielectric layer (not shown). The conduction plugs 17 and the metal layer 18 may be formed in the first dielectric layer, and the top surface of the metal layer 18 may be leveled with the top surface of the first dielectric layer. Moreover, the memory cell may include a second dielectric layer (not shown) formed on the first dielectric layer. The RRAM device 16 may be formed in the second dielectric layer and the top surface of the RRAM device 16 may be leveled with the top surface of the second dielectric layer.

Figure 17:
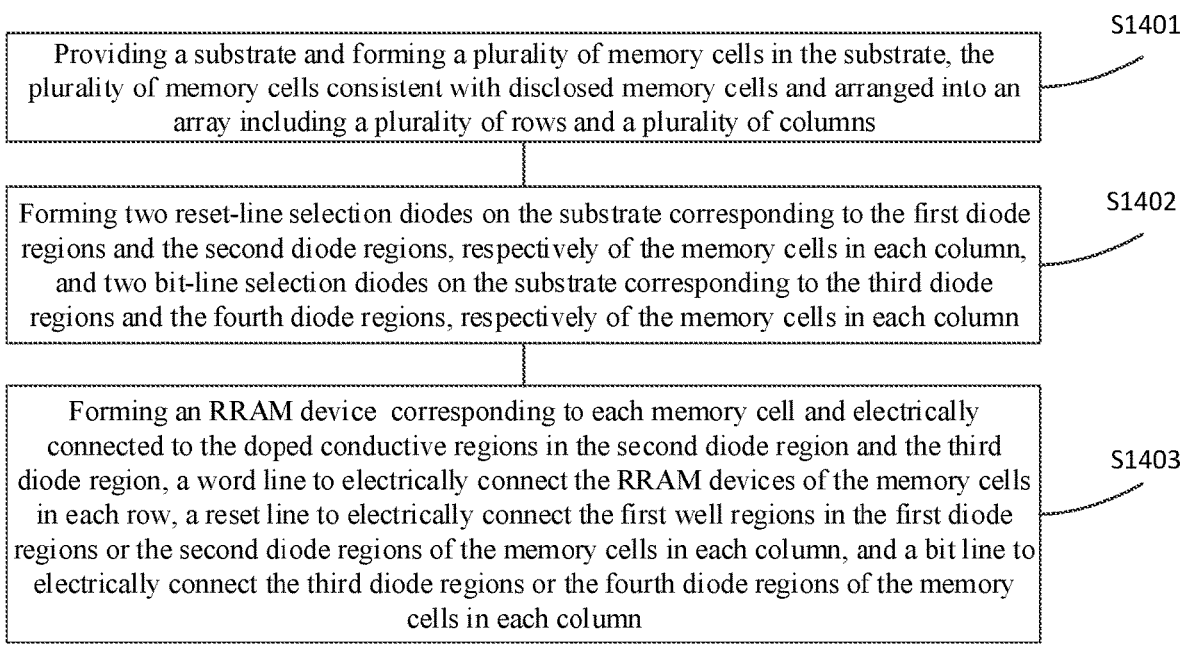
FIG. 17 illustrates a flowchart of an exemplary method for fabricating a memory array structure consistent with various embodiments of the present disclosure.

The present disclosure also provides a method for fabricating a memory array structure. The memory array structure may include a plurality of memory cells arranged into an array with a plurality of rows and a plurality of columns. FIG. 17 illustrates a flowchart of an exemplary method for fabricating a memory array structure consistent with various embodiments of the present disclosure. FIGS. 6-14 illustrate schematic views of semiconductor structures at certain stages of the exemplary method for fabricating the memory array structure.

Figure 6:
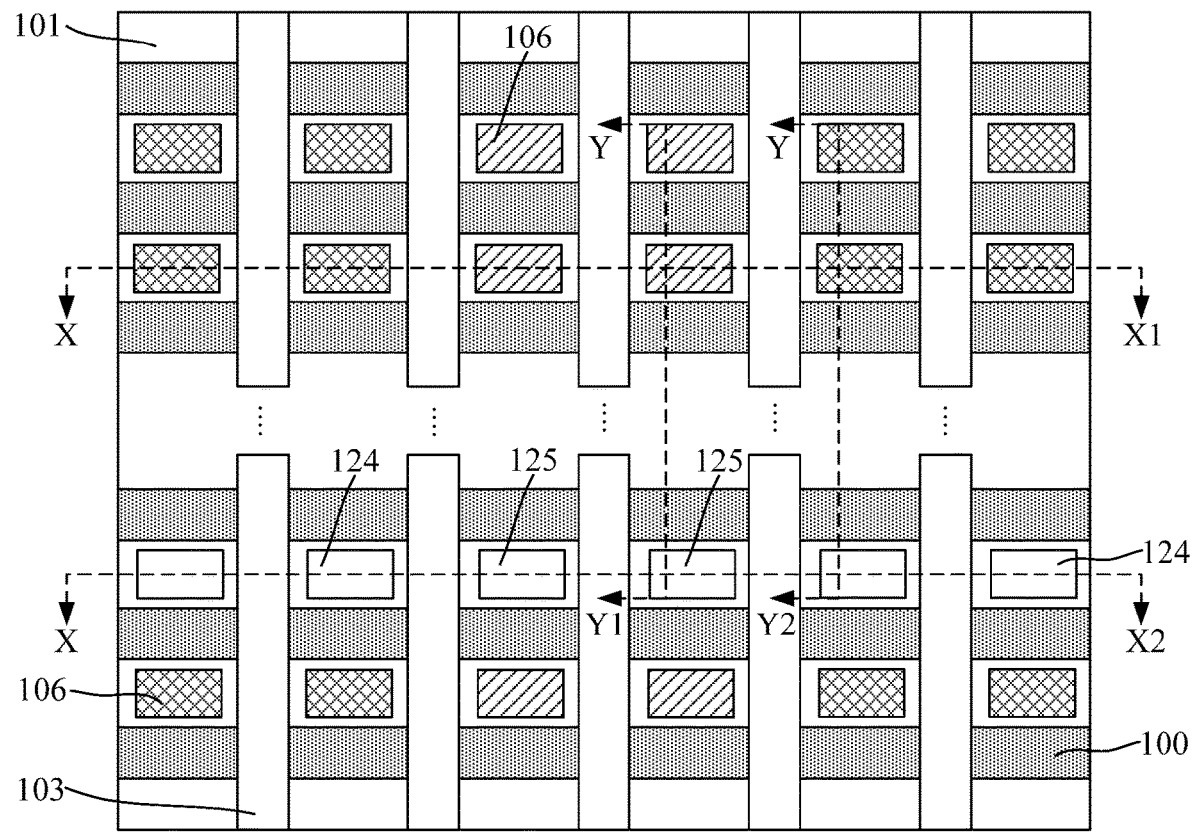
FIGS. 6-14 illustrate schematic views of semiconductor structures at certain stages of an exemplary method for fabricating a memory array structure consistent with various embodiments of the present disclosure.
Figure 7:
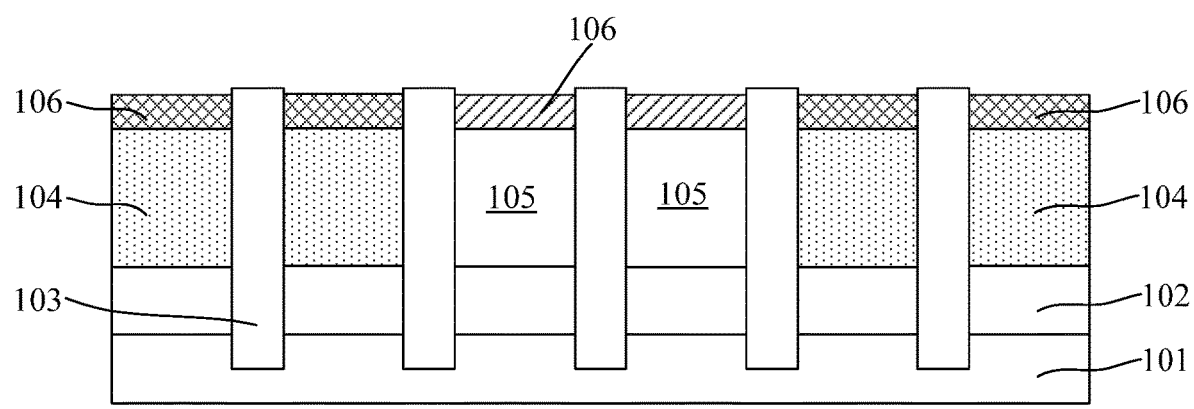
Figure 8:
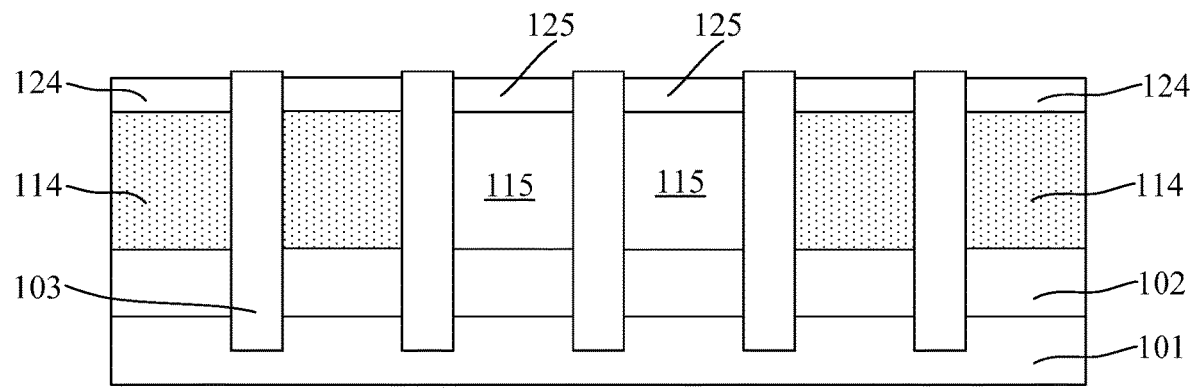
Figure 9:
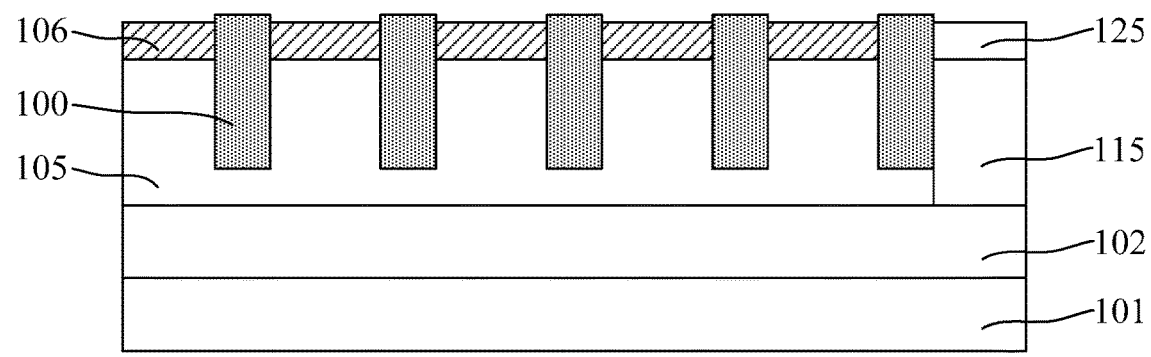
Figure 10:
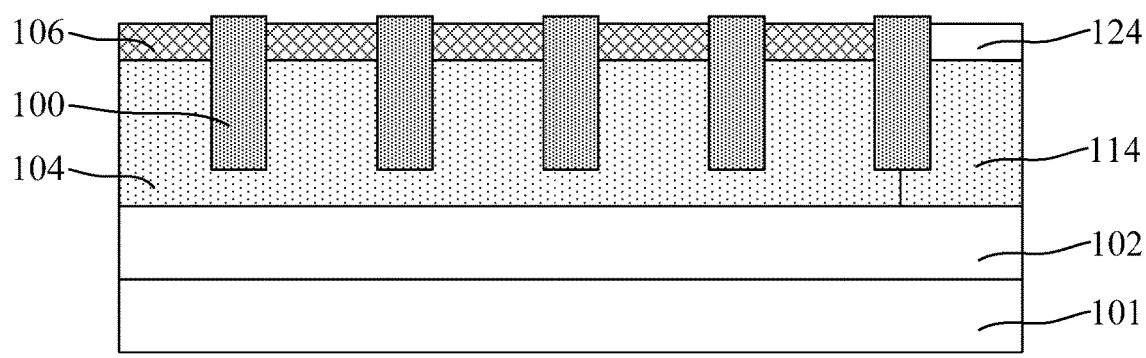

Referring to FIG. 17, a substrate may be provided, and a plurality of memory cells consistent with the embodiments above may be formed into an array including a plurality of rows and a plurality of columns (S1401). FIGS. 6-10 show schematic views of a semiconductor structure consistent with various embodiments of the present disclosure. Specifically, FIG. 6 shows a schematic top view of the semiconductor structure, FIG. 7 shows a schematic cross-section view of the semiconductor structure shown in FIG. 6 along an XX1 direction, FIG. 8 shows a schematic cross-section view of the semiconductor structure shown in FIG. 6 along an XX2 direction, FIG. 9 shows a schematic cross-section view of the semiconductor structure shown in FIG. 6 along a YY1 direction, and FIG. 10 shows a schematic cross-section view of the semiconductor structure shown in FIG. 6 along a YY2 direction.

Referring to FIGS. 6-10, a plurality of memory cells consistent with the disclosed memory cells may be formed into an array with a plurality of rows and a plurality of columns. According to the disclosed memory cells, the plurality of memory cells may include a plurality of RRAM devices. In one embodiment, the RRAM devices of the plurality of memory cells may be formed in a subsequent process. That is, only the portion of the plurality of memory cells in the substrate 101 may be formed in Step S1401.

Moreover, the first well regions 104 in the first diode regions (not labeled) of the memory cells in a same column may be connected to each other, the first well regions 104 in the second diode regions (not labeled) of the memory cells in a same column may be connected to each other, the second well regions 105 in the third diode regions (not labeled) of the memory cells in a same column may be connected to each other, and the second well regions 105 in the fourth diode regions (not labeled) of memory cells in a same column may be connected to each other.

The process to form the portion of the plurality of memory cells in the substrate 101 may include the following exemplary steps. First, a substrate 101 may be provided. The substrate 101 may include a first diode region (not labeled), a second diode region (not labeled), a third diode region (not labeled), and a fourth diode region (not labeled) arranged consecutively along the row direction. Further, a first well region 104 may be formed in the substrate 101 of the first diode region and the second diode region, and a second well region 105 may be formed in the substrate 101 of the third diode region and the fourth diode region. The doping type of the second well region 105 may be different from the doping type of the first well region 104. Further, a doped conductive region 106 may be formed on the first well region 104 and the second well region 105. A deep trench isolation structure 103 may then be formed on the substrate 101. The deep trench isolation structure 103 may electrically isolate the portion of the first well region 104 in the first diode region from the portion of the first well region 104 in the second diode region, and the portion of the second well region 105 in the third diode region from the portion of the second well region 105 in the fourth diode region. The deep trench isolation structure 103 may also electrically isolate the portion of the doped conductive region 106 in the first diode region from the portion of the doped conductive region 106 in the second diode region, and the portion of the doped conductive region 106 in the third diode region from the portion of the doped conductive region 106 in the fourth diode region.

The detailed fabrication methods for the portion of the memory cells in the substrate 101 may be referred to the corresponding description in the above embodiments of the disclosed methods for fabricating memory cells. For illustration purpose, for each row of the array of memory cells, FIGS. 6-10 show only one memory cell together with the first diode region and the second diode region of another memory cell. That is, FIGS. 6-10 show only one complete memory cell and a portion of another memory cell (i.e. the first diode region and the second diode region), although more components or memory cells may be further included according to various embodiments of the present disclosure.

Referring to FIGS. 6-10, the deep trench isolation structure 103 may also electrically isolate the first well region 104 and the second well region 105 in neighboring memory cells. The plurality of deep trench isolation structures 103 may be arranged in the row direction, and the extending direction of each deep trench isolation structure 103 may be parallel to the column direction.

In one embodiment, the first well regions 104 of the memory cells in a same column may be formed by a same process, and the second well regions 105 of the memory cells in a same column may also be formed by a same process. In order to further reduce the process steps, the first well regions 104 of memory cells in different columns may be formed in a same process, and the second well regions of memory cells in different columns may also be formed in a same process.

In one embodiment, the first well regions 104 and the second well regions 105 may be formed before forming the deep trench isolation structures 103. In other embodiment, the first well regions and the second well regions may be formed after the deep trench isolation structures are formed.

The doping type of the first well regions 104 and the doping type of the second well regions 105 may be referred to the above description of the memory cells consistent with various embodiments of the present disclosure. In one embodiment, the doping type of the first well regions 104 may be P-type, and the doping type of the second well regions 105 may be N-type. In order to prevent the P-types ions in the first well regions 104 from diffusing into the substrate 101, prior to forming the first well regions 104 and the second well regions 105, an N-type deep well region 102 may be formed in the substrate 101 such that each first well region 104 may be separated from the substrate 101 by the N-type deep well region 102. In addition, each second well region 105 may also be separated from the substrate 101 by the N-type deep well region 102. Moreover, the N-type deep well region 102 may be doped with N-type doping ions.

In one embodiment, a plurality of shallow trench isolation structures 100 may be formed in the substrate 101. The bottom surfaces of the shallow trench isolation structures 100 may be higher than the bottom surfaces of the first well regions 104 and also higher than the bottom surfaces of the second well regions 105.

The plurality of shallow trench isolation structures 100 may be arranged in the column direction, and the extending direction of each shallow trench isolation structure 100 may be parallel to the row direction.

In one embodiment, in order to simplify the steps of the fabrication process, the plurality of shallow trench isolation structures 100 may be formed during the process to form the plurality of deep trench isolation structures 103.

In one embodiment, the first well regions 104 in the first diode regions of the memory cells in a same column may be electrically connected to a subsequently-formed reset line and the first well regions 104 in the second diode regions of the memory cells in a same column may also be electrically connected to another subsequently-formed reset line. Moreover, in order to lead each reset line out, a reset-line selection diode may be formed on the substrate 101. Similarly, the second well regions 105 in the third diode regions of the memory cells in a same column may be electrically connected to a subsequently-formed bit line and the second well regions 105 in the fourth diode regions of the memory cells in a same column may also be electrically connected to another subsequently-formed bit line, and in order to lead each bit line out, a bit-line selection diode may be formed on the substrate 101.

Returning to FIG. 17, corresponding to the first diode regions or the second diode regions of the memory cells in each column of the array, a reset-line selection diode may be formed on the substrate, and corresponding to the third diode regions or the fourth diode regions of the memory cells in each column of the array, a bit-line selection diode may be formed on the substrate (S1402).

Referring to FIGS. 6-10, corresponding to the first diode regions or the second diode regions of the memory cells in a same column, a reset-line selection diode may be formed on the substrate 101, and corresponding to the third diode regions or the fourth diode regions of the memory cells in a same column, a bit-line selection diode may be formed on the substrate 101. Therefore, the number of the reset-line diodes may be two times of the number of the columns of the memory cell array, and the number of the bit-line diodes may also be two times of the number of the columns of the memory cell array. The reset-line selection diodes may be electrically connected to subsequently-formed reset lines, and the bit-line selection diodes may be electrically connected to subsequently-formed bit lines. Moreover, the plurality of reset-line selection diodes and the plurality of bit-line selection diodes may be formed in a same row.

In one embodiment, the process to form the reset-line selection diodes may include the following exemplary steps. First, during the process to form the plurality of first well regions 104, a plurality of reset-line selection well regions 114 may also be formed in the substrate 101. Each reset-line selection well region 114 may be electrically connected to the first well regions 104 of the memory cells in a same column. Further, during the process to form the doped conductive region 106, a reset-line doped conductive region 124 may also be formed on each reset-line selection well region 114. The doping type of the reset-line doped conductive region 124 may be the same as the doping type of the reset-line selection well region 114, and each reset-line doped conductive region 124 may be electrically connected to a subsequently-formed reset line.

The process to form the bit-line selection diodes may include the following exemplary steps. First, during process to form the plurality of second well regions 105, a plurality of bit-line selection well regions 115 may also be formed in the substrate 101. Each bit-line selection well region 115 may be electrically connected to the second well regions 105 of the memory cells in a same column. Further, during the process to form the doped conductive region 106, a bit-line doped conductive region 125 may also be formed on each bit-line selection well region 115. The doping type of the bit-line doped conductive region 125 may be the same as the doping type of the bit-line selection well region 115, and each bit-line doped conductive region 125 may be electrically connected to a subsequently-formed bit line.

Figure 11:
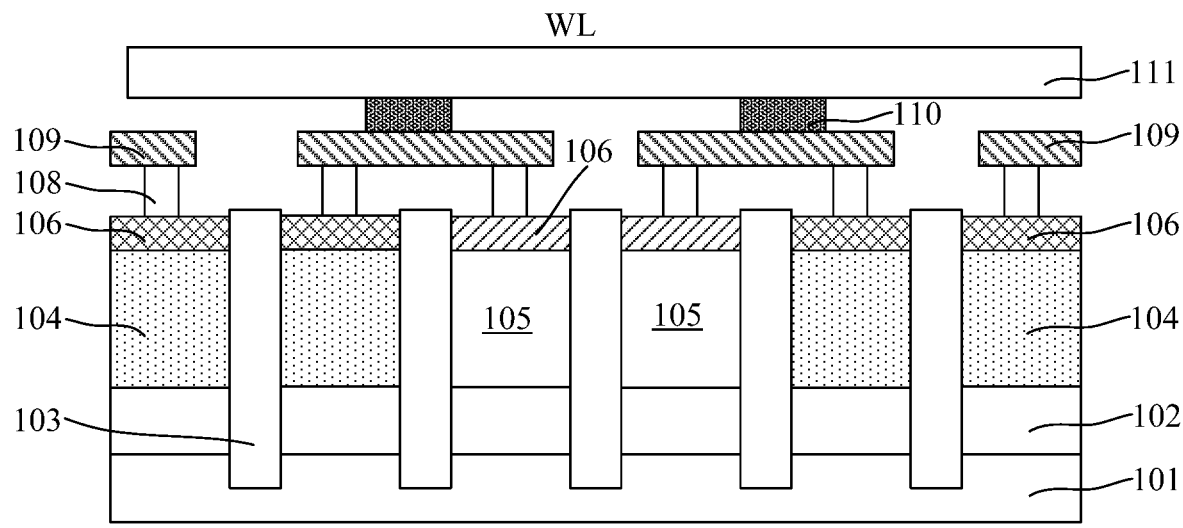
Figure 12:
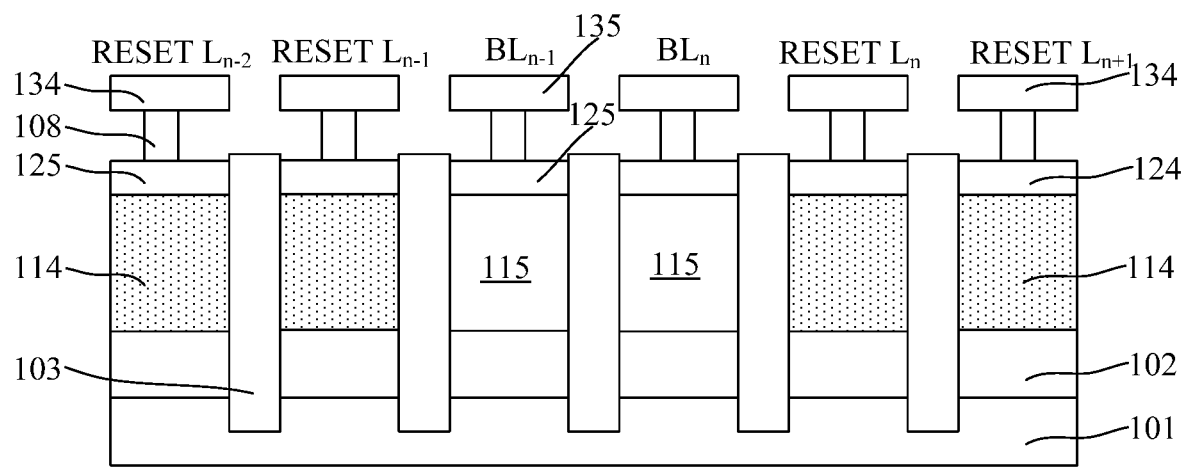
Figure 13:
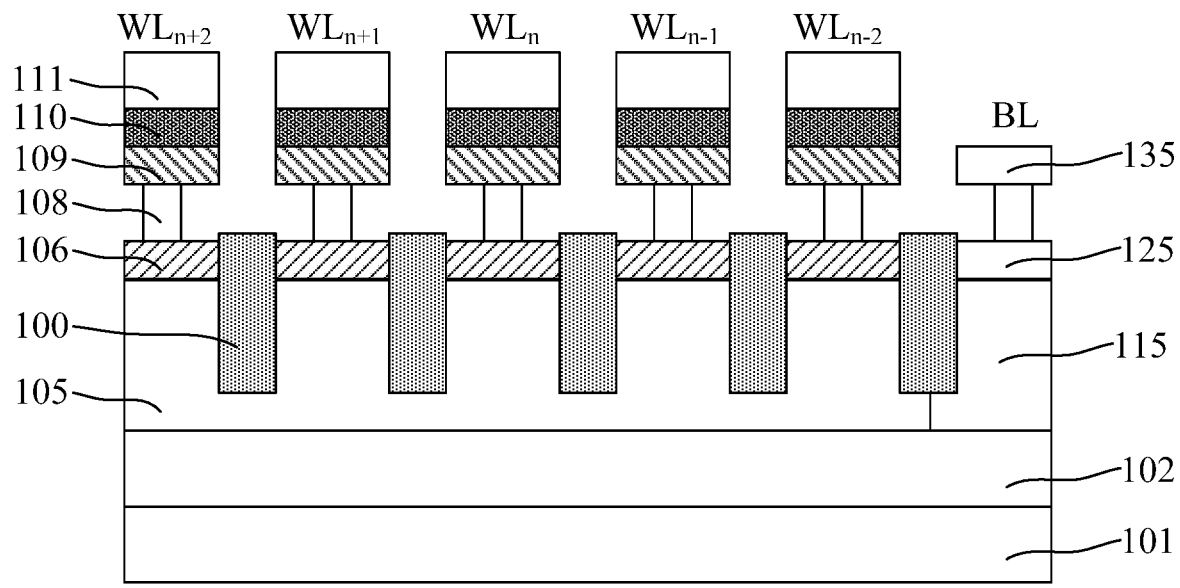
Figure 14:
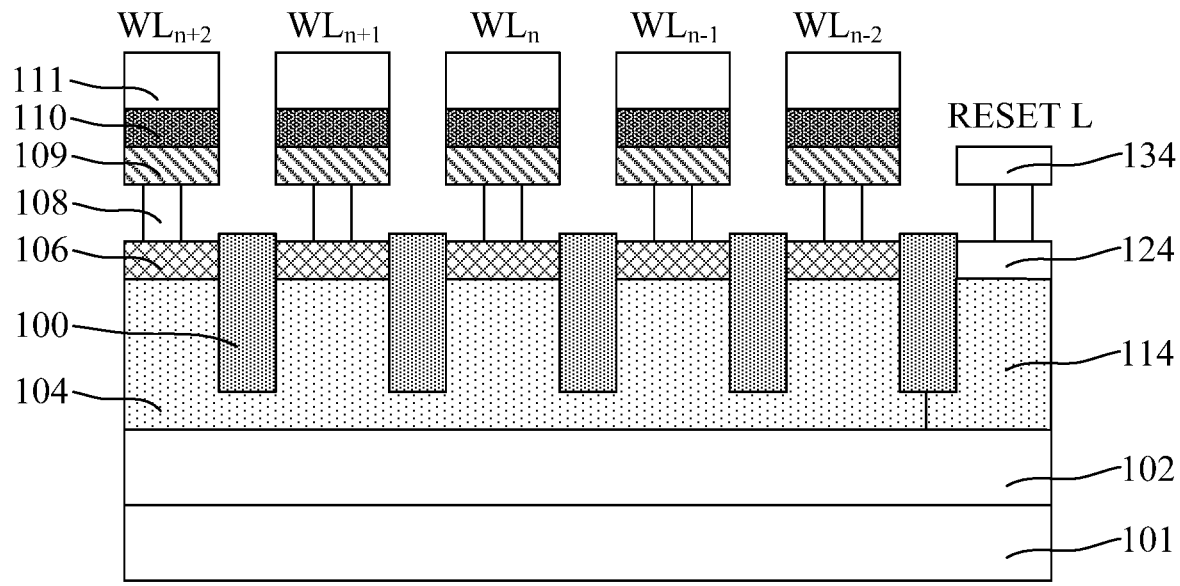

Further, returning to FIG. 17, an RRAM device corresponding to each memory cell and electrically connected to the doped conductive regions in the second diode region and the third diode region may be formed on the substrate, a word line may be formed to electrically connect the RRAM devices of the memory cells in each row of the array, a reset line to electrically connected the first well regions in the first diode regions or the second diode regions of the memory cells in each column of the array, and a bit line to electrically connect the second well regions in the third diode regions or the fourth diode regions of the memory cells in each column of the array (S1403). FIGS. 11-14 show schematic cross-section views of a semiconductor structure consistent with various embodiments of the present disclosure. Specifically, FIG. 11 shows a schematic cross-section view of a semiconductor structure developed from the structure shown in FIG. 7, FIG. 12 shows a schematic cross-section view of a semiconductor structure developed from the structure shown in FIG. 8, FIG. 13 shows a schematic cross-section view of a semiconductor structure developed from the structure shown in FIG. 9, and FIG. 14 shows a schematic cross-section view of a semiconductor structure developed from the structure shown in FIG. 10.

Referring to FIGS. 11-14, an RRAM device 110 corresponding to each memory cell may be formed on the substrate 101. The RRAM device may be electrically connected to the doped conductive region 106 in the second diode region and the doped conductive region 106 in the third diode region. A word line 111 may be formed to electrically connect the RRAM devices 110 of the memory cells in each row. A reset line may 134 be formed to electrically connected the first well regions 104 in the first diode regions or the second diode regions of the memory cells in each column. A bit line 135 may be formed to electrically connect the second well regions 105 in the third diode regions or the fourth diode regions of the memory cells in each column. Therefore, the number of the word lines 111 may be the number of the rows of the memory-cell array, the number of the reset lines 134 may be two times of the columns of the memory-cell array, and the number of the bit lines 135 may be two times of the columns of the memory-cell array. For illustration purpose, in FIGS. 11-14, the word lines 111 are further indicated by $WL_{n+2}$, $WL_{n+1}$, $WL_n$, $WL_{n-1}$, $WL_{n-2}$, and WL, the reset lines 134 are further indicated by Reset $L_{n-2}$, Reset $L_{n-1}$, Reset $L_n$, Reset $L_{n+1}$, and Reset L, and the bit lines 135 are further indicated by $BL_{n-1}$, $BL_n$, and BL.

In one embodiment, prior to forming the RRAM devices 110, the fabrication process may also include forming a plurality of conduction plugs 108 on the doped conductive region 106 corresponding to the second diode regions and the third diode regions, and forming a metal layer 109 to electrically connect the conduction plugs 108. The metal layer 109 may be formed between the conduction plugs 108 and the RRAM devices 110.

In one embodiment, through the conduction plugs 108 and the metal layer 109, the RRAM devices 110 may be electrically connected to the doped conductive regions 106 in the corresponding second diode regions and the corresponding third diode regions.

In one embodiment, a plurality of conduction plugs 108 may also be formed on the reset-line doped conductive regions 124 and the bit-line doped conductive regions 125. As such, a subsequently-formed reset line 134 may be electrically connected to the first well regions 104 of the memory cells in each column of the array, and a subsequently-formed bit line 135 may be electrically connected to the second well regions 105 of the memory cells in each column of the array.

During the process to form the metal layer 109, a reset line 134 may be formed to electrically connect the reset-line doped conductive region 124 for the memory cells in each column. The reset line 134 may be electrically connected to the reset-line doped conductive region 124 through a conduction plug 108. In addition, during the process to form the metal layer 109, a bit line 135 may be formed to electrically connect the bit-line doped conductive region 125 for the memory cells in each column. The bit line 135 may be electrically connected to the bit-line doped conductive region 125 through a conduction plug 108. Therefore, the metal layer 109, the reset line 134, and the bit line 135 may be formed in a same layer.

The metal layer 109, the reset line 134, and the bit line 135 may be made of a same material. In one embodiment, the metal layer 109 may be made of Cu. In other embodiments, the metal layer may be made of Al, W, or any other appropriate conductive material.

In one embodiment, a first dielectric layer (not shown) may be formed on the substrate 101 before the formation of the conduction plugs 108 and the metal layer 109 or may be formed on the substrate 101 during the process to form the conduction plugs 108 and the metal layer 109. Accordingly, the conduction plugs 108 and the metal layer 109 may be formed in the first dielectric layer, and the top surface of the first dielectric layer may be leveled with the top surface of the metal layer 109.

Further, after forming the metal layer 109, the plurality of RRAM devices 110 may be formed on the metal layer 109.

In one embodiment, a second dielectric layer (not shown) may be formed on the metal layer and the first dielectric layer 109 before the formation of the RRAM devices 110 or during the formation of the RRAM devices 110 such that the top surfaces of the RRAM devices 110 may be leveled with the top surface of the second dielectric layer.

Further, a word line 111 may be formed to electrically connect the RRAM devices 110 of the memory cells in a same row. In one embodiment, the word line 111 may be made of Cu. In other embodiment, the word line 111 may be made of Al, W, or any other appropriate conductive material. The plurality of word lines 111 may be arranged in the column direction and the extending direction of each word line 111 may be parallel to the row direction.

In one embodiment, the area size of the memory cell in the formed memory array structure may have a minimum size of 8 $F^2$, where F is the smallest feature dimension. Specifically, the minimum size of a memory cell along a word line direction may be 4 F and the minimum size of a memory cell along a bit line direction may be 2 F. Therefore, the minimum area size of the memory cell of the memory array structure is 8 $F^2$.

According to the disclosed methods for fabricating memory array structures, the first well regions 104 of the first diode regions and the second diode regions are formed in a same process, the lithography process window for forming the first well regions 104 may be large, and thus the position accuracy of the first well regions 104 may be improved. Moreover, the second well regions 105 of the third diode regions and the fourth diode regions are formed in a same process, the lithography process window for forming the second well regions 105 may also be large, and thus the position accuracy of the second well regions 105 may be improved. In addition, because the formed memory array structure may have a small size, the disclosed methods may match the miniaturization trend of device development.

Further, the present disclosure also provides a memory array structure. FIGS. 11-14 show schematic views of an exemplary memory array structure consistent with various embodiments of the present disclosure. FIG. 6 shows a schematic view of the portion of the memory array structure formed in the substrate.

Referring to FIG. 6 and FIGS. 11-14, the memory array structure may include a plurality of memory cells consistent with various embodiments of the present disclosure. The plurality of memory cells may be arranged into an array including a plurality of rows and a plurality of columns. The row direction of the array may be perpendicular to the column direction of the array.

Each memory cell may include a first diode region, a second diode region, a third diode region, and a fourth diode region arranged consecutively in the substrate 101 along the row direction. Each memory cell may also include a first well region 104 formed in the portion of the substrate 101 in the first diode region and the second diode region and a second well region 105 formed in the portion of the substrate 101 in the third diode region and the fourth diode region. The doping type in the second well region 105 may be different from the doping type in the first well region 104. Each memory cell may also include an RRAM device 110 formed on the substrate 101.

In the memory array structure, the plurality of first well regions 104 in the first diode regions of the memory cells in each column may be connected with each other, the plurality of first well regions 104 in the second diode regions of the memory cells in each column may be connected with each other, the plurality of second well regions 105 in the third diode regions of the memory cells in each column may be connected with each other, and the plurality of second well regions 105 in the fourth diode regions of the memory cells in each column may be connected with each other.

The memory array structure may also include a plurality of bit lines 111, a plurality of reset lines 134, and a plurality of bit lines 135. Moreover, the RRAM devices of memory cells in a same row may be connected to a bit line 111, the first diode regions or the second diode regions of memory cells in a same column may be connected to a reset line 134, and to the third diode regions or the fourth diode regions of memory cells in a same column may be connected to a bit line 135.

In one embodiment, each memory cell of the memory array structure may also include a doped conductive region 106 formed on the first well region 104 and the second well region 105, and a deep trench isolation structure 103 formed in the substrate 101. The deep trench isolation structure 103 may electrically isolate the first well region 104 in the first diode region from the first well region 104 in the second diode region, the second well region 105 in the third diode region from the second well region 105 in the fourth diode region, the doped conductive region 106 in the first diode region from doped conductive region 106 in the second diode region, and the doped conductive region 106 in the third diode region from doped conductive region 106 in the fourth diode region. The RRAM device 110 may be electrically connected to the doped conductive region 106 in the second diode region and the doped conductive region 106 in the third diode region.

The detailed description of the memory cell in the memory array structure may be referred to corresponding illustration in the above embodiments of the disclosed memory cells.

In one embodiment, the memory array structure may also include a plurality of reset-line selection diodes formed in the substrate 101 and electrically connected to the plurality of reset lines 134, and a plurality of bit-line selection diodes formed in the substrate 101 and electrically connected to the plurality of bit lines 135. Moreover, the plurality of reset-line selection diodes and the plurality of bit-line selection diodes may be formed in a same row.

Further, each reset-line selection diode may include a reset-line selection well region 114 formed in the substrate 101 and connected to the first well regions 104 of memory cells in a same column, and a reset-line doped conductive region 124 formed on the reset-line selection well region 114. The doping type of the reset-line doped conductive region 124 may be the same as the doping type of the reset-line selection well region 114, and the reset line doped conductive region 124 may be electrically connected to a corresponding reset line 134.

Moreover, each bit-line selection diode may include a bit-line selection well region 115 formed in the substrate 101 and connected to the second well regions 105 of memory cells in a same column, and a bit-line doped conductive region 125 formed on the bit-line selection well region 115. The doping type of the bit-line doped conductive region 125 may be the same as the doping type of the bit-line selection well region 115, and the bit line doped conductive region 125 may be electrically connected to a corresponding bit line 135.

In one embodiment, each memory cell may also include two conduction plugs 108 connected to the doped conductive region 106 in the second diode region and the third diode region, respectively. Moreover, each memory cell may further include a metal layer electrically connected to the conduction plugs 108. The RRAM device 110 may be formed on the metal layer 109. The reset line 134, the bit line 135, and the metal layer 109 may be formed in a same layer.

The deep trench isolation structure 103 may electrically isolate neighboring memory cells. The memory array structure may also include a plurality of shallow trench isolation structures 100 formed in the substrate 101. The plurality of shallow trench isolation structures 100 may electrically isolate the doped conductive regions 106 in neighboring memory cells.

Figure 15:
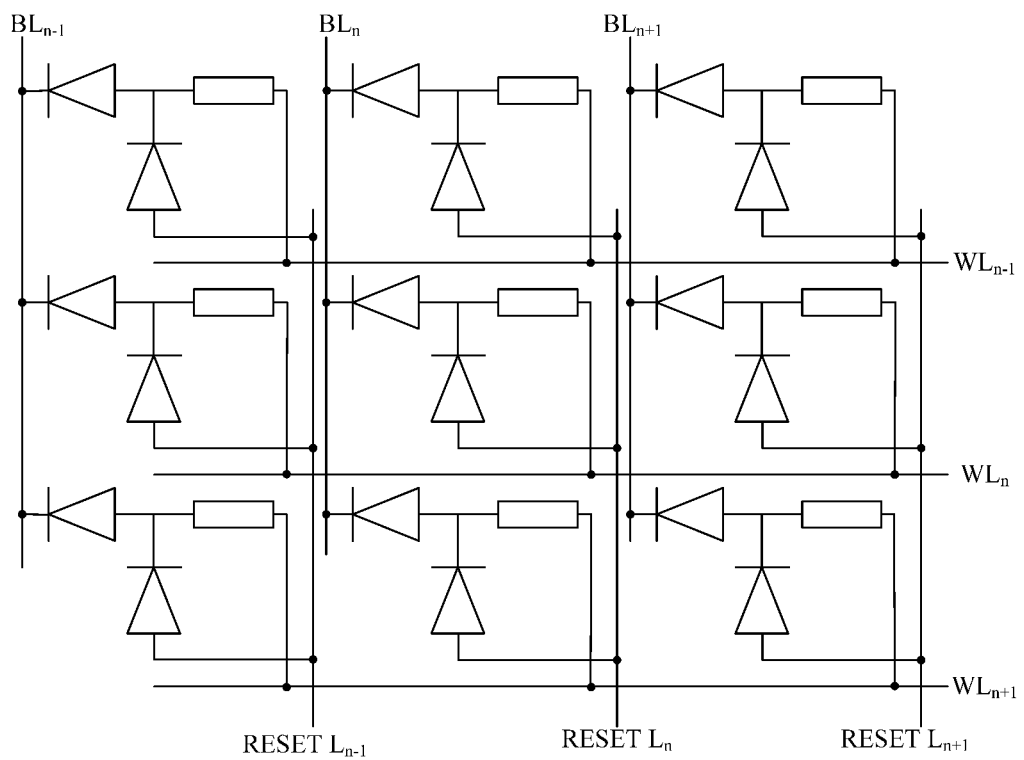
FIG. 15 illustrates an equivalent circuit diagram of an exemplary memory array structure consistent with various embodiments of the present disclosure.

FIG. 15 shows an equivalent circuit diagram of an exemplary memory array structure consistent with various embodiments of the present disclosure. Referring to FIG. 15, the diode in the second diode region, the diode in the third diode region, and the equivalent resistor of the RRAM device may form a 2D1R structure. The word lines $WL_{n-1}$, WL$_n$, and WL$_{n+1}$ may be electrically connected to the equivalent resistor of the RRAM device, the bit lines BL$_{n-1}$, BL$_n$, and BL$_{n-1}$ may be electrically connected to one diode in the 2D1R structure, and the reset lines Reset L$_{n-1}$, Reset L$_n$, and Reset L$_{n+1}$ may be electrically connected to the other diode in the 2D1R structure.

The memory array structure may have two operation states, i.e. selection state and non-selection state. The operation principle of the memory array structure according to the present disclosure includes the following aspects.

In the selection state, during a set operation, the word line WL may be connected to a set voltage V$_{set}$, the bit line BL may be connected to the ground (0V), and the reset line Reset L may be suspended; during a reset operation, the word line WL may be connected to the ground, the bit line BL may be suspended, and the reset line Reset L may be connected to a reset voltage V$_{reset}$; and during a read operation, the word line WL may be connected to a read voltage V$_{read}$, the bit line BL may be connected to the ground, and the reset line Reset L may be suspended.

In the non-selection state, during a set operation, the word line WL, the bit line BL, and the reset line Reset L may all be suspended; during a reset operation, the word line WL and the bit line BL may be suspended, and the reset line Reset L may be connected to the ground; and during a read operation, the word line WL, the bit line BL, and the reset line Reset L may all be suspended.

The following table summarizes the connections of the word line, the bit line, and the reset line corresponding to different operation options in both the selection state and the non-selection state.

|  | Selection State | | | Non-selection State | | |
| --- | --- | --- | --- | --- | --- | --- |
|  | WL | BL | RESET L | WL | BL | RESET L |
| Set Operation | V$_{set}$ | 0 V | Suspending | Suspending | Suspending | Suspending |
| Reset Operation | 0 V | Suspending | V$_{reset}$ | Suspending | Suspending | 0 V |
| Read Operation | V$_{read}$ | 0 V | Suspending | Suspending | Suspending | Suspending |

Compared to conventional memory cells, memory array structures, and fabrication methods, the disclosed memory cells, memory array structures, and fabrication methods may demonstrate several advantages.

According to the disclosed memory cells, memory array structures, and fabrication methods, the first well region may be formed simultaneously in the substrate of the first diode region and the second diode region, the second well region may also be formed simultaneously in the substrate of the third diode region and the fourth diode region. Therefore, the lithography process window for forming the first well region according to the present disclosure may be larger than the lithography process window for separately forming the first well region in each of the first diode region and the second diode region, and the lithography process window for forming the second well region according to the present disclosure may also be larger than the lithography process window for separately forming the second well region in each of the third diode region and the fourth diode region. Therefore, the position accuracy of the formed first well region and the formed second well region may be improved. In addition, because the photolithography process windows for the first well region and the second well region are increased, the area size of the memory cell formed accordingly may be smaller.

Further, According to the disclosed memory cells, memory array structures, and fabrication methods, a doped conductive region is formed on the first well region and the second well region. The doped conductive region together with the first well region under the doped conductive region may form a diode, and the doped conductive region together with the second well region under the doped conductive region may also form a diode. A deep trench isolation structure is formed in the substrate to electrically isolate the first well region in the first diode region from the first well region in the second diode region, and the second well region in the third diode region from the second well region in the fourth diode region. The deep trench isolation structure may also electrically isolate different portions of the doped conductive region in neighboring diode regions. Therefore, the diodes in the memory cells are electrically isolated from each other. Further, an RRAM device electrically connected to the doped conductive regions in the second diode region and the third diode region may be formed, and thus the memory cell has a 2D1R structure. As such, the area size of the 2D1R structure of the memory cell can be small.

Moreover, according to the disclosed memory array structure and fabrication methods, the memory array structure includes a plurality of memory cells described above. Therefore, the size of the memory array structure may be made significantly small.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A memory cell, comprising:
 a substrate including a first diode region, a second diode region, a third diode region, and a fourth diode region arranged consecutively in a row direction;
 a first well region formed in the substrate of the first diode region and the second diode region;
 a second well region formed in the substrate in the third diode region and the fourth diode region, wherein a doping type of the second well region is different from a doping type in the first well region;
 an N-type deep well region formed in the substrate under the first well region and the second well region;
 a doped conductive region formed on the first well region and the second well region;
 deep trench isolation structures formed in the substrate, each of the deep trench isolation structures passing through the N-type deep well region, the first well region or the second well region, and the doped conductive region sequentially, wherein the deep trench isolation structures electrically isolate a first region of the first well region in the first diode region from a second region of the first well region in the second diode region, a first region of the second well region in the third diode region from a second region of the second well region in the fourth diode region, a first portion of the doped conductive region in the first diode region from a second portion of the doped conductive region in the second diode region, and a third portion of the doped conductive region in the third diode region from a fourth portion of the doped conductive region in the fourth diode region; and a resistance random access memory (RRAM) device formed over the substrate, wherein the RRAM device is electrically connected to the doped conductive region in the second diode region and the doped conductive region in the third diode region.

2. The memory cell according to claim 1, further including: conduction plugs formed on and electrically connected to the doped conductive region on the second diode region and the third diode region, respectively; and a metal layer connected to the conduction plugs, wherein the metal layer is formed between the conduction plugs and the RRAM device.

3. The memory cell according to claim 1, wherein:
the deep trench isolation structures also electrically isolates the second region of the first well region in the second diode region from the first region of the second well region in the third diode region, and the second portion of the doped conductive region in the second diode region from the third portion of the doped conductive region in the third diode region.

4. The memory cell according to claim 1, wherein:
the deep trench isolation structures are made of a material including $SiO_x$, $SiN_x$, and SiON.

5. The memory cell according to claim 1, wherein a bottom surface of each of the deep trench isolation structures is lower than a bottom surface of the N-type deep well region.

6. The memory cell according to claim 1, wherein:
a doping type of a portion of the doped conductive region formed on the first well region is different from the doping type of the first well region; and
a doping type of a portion of the doped conductive region formed on the second well region is different from the doping type of the second well region.

7. The memory cell according to claim 6, wherein:
the doping type of the first well region is N-type;
the doping type of the second well region is P-type;
the doping type of the portion of the doped conductive region formed on the first well region is P-type; and
the doping type of the portion of the doped conductive region formed on the second well region is N-type.

8. The memory cell according to claim 6, wherein:
the doping type of the first well region is P-type;
the doping type of the second well region is N-type;
the doping type of the portion of the doped conductive region formed on the first well region is N-type; and
the doping type of the portion of the doped conductive region formed on the second well region is P-type.

9. A memory array structure, comprising:
a plurality of memory cells according to claim 1, arranged into an array with a plurality of rows perpendicular to a plurality of columns, wherein the first well regions in the first diode regions of the memory cells in a same column are connected to each other, the first well regions in the second diode regions of the memory cells in a same column are connected to each other, the second well regions in the third diode regions of the memory cells in a same column are connected to each other, and the second well regions in the fourth diode regions of the memory cells in a same column are connected to each other;

a plurality of word lines, wherein the RRAM devices of the memory cells in a same row are electrically connected to one word line;

a plurality of reset lines, wherein the first well regions in the first diode regions of the memory cells in a same column are electrically connected to one reset line and the first well regions in the second diode regions of the memory cells in a same column are also electrically connected to one reset line; and a plurality of bit lines, wherein the second well regions in the third diode regions of the memory cells in a same column are electrically connected to one bit line and the second well regions in the fourth diode regions of the memory cells in a same column are also electrically connected to one bit line.

10. The memory array structure according to claim 9, further including:
a plurality of reset-line selection diodes formed in the substrate with each reset-line selection diode connected to a reset line; and
a plurality of bit-line selection diodes formed in the substrate with each bit-line selection diode connected to a bit line, wherein:
the plurality of reset-line selection diodes and the plurality of bit-line selection diodes are arranged in the row direction;
each reset-line selection diode includes a reset-line selection well region formed in the substrate and connected to the first well regions of the memory cells in a same column of the reset-line selection diode, and a reset-line doped conductive region formed on the reset-line selection well region, wherein the reset-line doped conductive region and the reset-line selection well region have a same doping type, and each reset-line doped conductive region is electrically connected to a reset line, and
each bit-line selection diode includes a bit-line selection well region formed in the substrate and connected to the second well regions of the memory cells in a same column of the bit-line selection diode, and a bit-line doped conductive region formed on the bit-line selection well region, wherein the bit-line doped conductive region and the bit-line selection well region have a same doping type, and each bit-line doped conductive region is electrically connected to a bit line.

11. The memory array structure according to claim 9, wherein:
each memory cell also includes conduction plugs electrically connected to the doped conductive region in the second diode region and the third diode region, respectively and a metal layer electrically connected to the conduction plugs, wherein:
the RRAM device is formed on the metal layer; and
the reset line, the bit line, and the metal layer are formed in a same layer.

12. The memory array structure according to claim 9, wherein:
the deep trench isolation structures also electrically isolates neighboring memory cells; and
the memory array structure also includes a plurality of shallow trench isolation structures formed in the substrate to electrically isolate the doped conductive regions of neighboring memory cells.

13. A method for fabricating a memory cell, comprising:
providing a substrate including a first diode region, a second diode region, a third diode region, and a fourth diode region arranged consecutively in a row direction;
forming a first well region in the substrate of the first diode region and the second diode region;
forming a second well region in the substrate in the third diode region and the fourth diode region, wherein a doping type of the second well region is different from a doping type in the first well region;
forming an N-type deep well region in the substrate under the first well region and the second well region;
forming a doped conductive region on the first well region and the second well region;
forming deep trench isolation structures in the substrate to electrically isolate a first region of the first well region in the first diode region from a second region of the first well region in the second diode region, a first region of the second well region in the third diode region from a second region of the second well region in the fourth diode region, a first portion of the doped conductive region in the first diode region from a second portion of the doped conductive region in the second diode region, and a third portion of the doped conductive region in the third diode region from a fourth portion of the doped conductive region in the fourth diode region, wherein each of the deep trench isolation structures passes through the N-type deep well region, the first well region or the second well region, and the doped conductive region sequentially; and
forming an RRAM device over the substrate to electrically connect to the doped conductive region in the second diode region and the doped conductive region in the third diode region.

14. The method for fabricating the memory cell according to claim 13, wherein:
an order to form the deep trench isolation structure and form the first well region and the second well region is interchangeable.

15. The method for fabricating the memory cell according to claim 13, wherein:
forming the N-type deep well region in the substrate is performed prior to forming the first well region and the second well region.

16. The method for fabricating the memory cell according to claim 13, prior to
forming the RRAM device, further including:
forming conduction plugs to electrically connect the doped conductive region on the second diode region and the third diode region, respectively; and
forming a metal layer to electrically connect the conduction plugs, wherein the metal layer is formed between the conduction plugs and the RRAM device.

17. A method for fabricating a memory array structure, comprising:
forming a plurality of memory cells into an array with a plurality of rows perpendicular to a plurality of columns, wherein:
forming each memory cell on the substrate includes:
providing a substrate including a first diode region, a second diode region, a third diode region, and a fourth diode region arranged consecutively in a row direction;
forming a first well region in the substrate of the first diode region and the second diode region;
forming a second well region in the substrate in the third diode region and the fourth diode region, wherein a doping type of the second well region is different from a doping type in the first well region;
forming a doped conductive region on the first well region and the second well region;
forming deep trench isolation structures in the substrate to electrically isolate a first region of the first well region in the first diode region from a second region of the first well region in the second diode region, a first region of the second well region in the third diode region from a second region of the second well region in the fourth diode region, a first portion of the doped conductive region in the first diode region from a second portion of the doped conductive region in the second diode region, and a third portion of the doped conductive region in the third diode region from a fourth portion of the doped conductive region in the fourth diode region; and
forming an RRAM device over the substrate to electrically connect to the doped conductive region in the second diode region and the doped conductive region in the third diode region, wherein
the first well regions in the first diode regions of the memory cells in a same column are connected to each other, the first well regions in the second diode regions of the memory cells in a same column are connected to each other, the second well regions in the third diode regions of the memory cells in a same column are connected to each other, and the second well regions in the fourth diode regions of the memory cells in a same column are connected to each other;
forming a plurality of word lines, wherein the RRAM devices of the memory cells in a same row are electrically connected to one word line;
forming a plurality of reset lines, wherein the first well regions in the first diode regions of the memory cells in a same column are electrically connected to one reset line and the first well regions in the second diode regions of the memory cells in a same column are also electrically connected to one reset line; and
forming a plurality of bit lines, wherein the second well regions in the third diode regions of the memory cells in a same column are electrically connected to one bit line and the second well regions in the fourth diode regions of the memory cells in a same column are also electrically connected to one bit line.

18. The method for fabricating the memory array structure according to claim 17, further including:
forming a plurality of shallow trench isolation structures in the substrate to electrically isolate the doped conductive regions of neighboring memory cells.

19. The method for fabricating the memory array structure according to claim 17, further including forming a plurality of reset-line selection diodes in the substrate to electrically connect the plurality of reset lines and forming a plurality of bit-line selection diodes in the substrate to electrically connect the plurality of bit lines, wherein:
the plurality of reset-line selection diodes and the plurality of bit-line selection diodes are arranged in the row direction;
forming the reset-line selection diodes includes: forming a plurality of reset-line selection well regions in the substrate during forming the first well regions, each reset-line selection well region connected to the first well regions of the memory cells in a same column of the reset-line selection diode, and forming a plurality of reset-line doped conductive regions on the plurality of reset-line selection well regions, the reset-line doped conductive regions and the reset-line selection well regions having a same doping type and each reset-line doped conductive region electrically connected to a reset line; and forming the bit-line selection diodes includes: forming a plurality of bit-line selection well regions in the substrate during forming the second well regions, each bit-line selection well region connected to the second well regions of the memory cells in a same column of the bit-line selection diode, and forming a plurality of bit-line doped conductive regions on the plurality of bit-line selection well regions, the bit-line doped conductive regions and the bit-line selection well regions having a same doping type and each bit-line doped conductive region electrically connected to a bit line.

20. The method for fabricating the memory array structure according to claim 17, prior to forming the RRAM device on each memory cell, further including:

forming two conduction plugs electrically connected to the doped conductive region in the second diode region and the third diode region, respectively in each memory cell; and forming a metal layer electrically connected to the two conduction plugs, wherein:

the metal layer is formed between the conduction plugs and the RRAM device; and the reset line, the bit line, and the metal layer are formed in a same layer through a same process.

* * * * *